(12) United States Patent
Mooradian et al.

(10) Patent No.: US 7,296,897 B2
(45) Date of Patent: Nov. 20, 2007

(54) PROJECTION DISPLAY APPARATUS, SYSTEM, AND METHOD

(75) Inventors: Aram Mooradian, Kentfield, CA (US); Andrei V. Shchegrov, Campbell, CA (US); Jason P. Watson, San Jose, CA (US)

(73) Assignee: Novalux, Inc., Sunnyvale, CA (US)

( * ) Notice: Subject to any disclaimer, the term of this patent is extended or adjusted under 35 U.S.C. 154(b) by 0 days.

(21) Appl. No.: 11/193,317

(22) Filed: Jul. 29, 2005

(65) Prior Publication Data

US 2006/0023173 A1 Feb. 2, 2006

Related U.S. Application Data

(60) Provisional application No. 60/689,582, filed on Jun. 10, 2005, provisional application No. 60/667,201, filed on Mar. 30, 2005, provisional application No. 60/667,202, filed on Mar. 30, 2005, provisional application No. 60/666,826, filed on Mar. 30, 2005, provisional application No. 60/646,072, filed on Jan. 21, 2005, provisional application No. 60/592,890, filed on Jul. 30, 2004.

(51) Int. Cl.
*H01S 3/098* (2006.01)
*H01S 3/10* (2006.01)
*G03B 21/00* (2006.01)
*G03B 21/26* (2006.01)

(52) U.S. Cl. ............................. 353/31; 353/94; 372/18; 372/21

(58) Field of Classification Search .................. 353/31, 353/34, 37, 94, 97, 121, 122; 348/744, 750; 372/21, 18, 50.124; 345/83
See application file for complete search history.

(56) References Cited

U.S. PATENT DOCUMENTS

| 5,410,560 | A | * | 4/1995 | Taira ............................ 372/21 |
| 5,489,984 | A |   | 2/1996 | Hariharan et al. |
| 5,585,913 | A |   | 12/1996 | Hariharan et al. |
| 5,704,700 | A | * | 1/1998 | Kappel et al. ................. 353/31 |
| 5,748,317 | A |   | 5/1998 | Maris et al. |
| 6,271,921 | B1 |   | 8/2001 | Maris et al. |
| 6,317,170 | B1 | * | 11/2001 | Hwang et al. .............. 348/750 |
| 6,400,449 | B2 |   | 6/2002 | Maris et al. |
| 6,947,459 | B2 | * | 9/2005 | Kurtz et al. ............. 372/43.01 |
| 6,975,294 | B2 | * | 12/2005 | Manni et al. .................. 345/83 |
| 6,975,366 | B2 | * | 12/2005 | Flint .......................... 348/744 |
| 2006/0023757 | A1 | * | 2/2006 | Mooradian et al. ........... 372/18 |
| 2006/0268241 | A1 | * | 11/2006 | Watson et al. ................ 353/94 |
| 2006/0280219 | A1 | * | 12/2006 | Shchegrov ................... 372/99 |
| 2007/0147458 | A1 | * | 6/2007 | Watson et al. ......... 372/50.124 |
| 2007/0153862 | A1 | * | 7/2007 | Shchegrov et al. ..... 372/50.124 |
| 2007/0153866 | A1 | * | 7/2007 | Shchegrov et al. ..... 372/50.124 |

\* cited by examiner

*Primary Examiner*—Melissa Jan Koval
(74) *Attorney, Agent, or Firm*—Cooley Godward Kronish LLP (57) ABSTRACT

In an apparatus, system, and method for generating a projected display, a light source generates red, green, and blue light using arrays of extended cavity surface emitting semiconductor lasers. The beams of individual lasers overlap and have a distribution of optical attributes selected to reduce speckle on a display surface.

30 Claims, 5 Drawing Sheets

PROJECTION DISPLAY APPARATUS, SYSTEM, AND METHOD

CROSS-REFERENCE TO RELATED APPLICATIONS

This application claims the benefit of provisional application 60/592,890, filed on Jul. 30, 2004; 60/667,201 filed on Mar. 30, 2005; 60/667,202 filed on Mar. 30, 2005; 60/666,826 filed on Mar. 30, 2005; 60/646,072 filed on Jan. 21, 2005; and 60/689,582 filed on Jun. 10, 2005, the contents of each of which are hereby incorporated by reference.

FIELD OF THE INVENTION

The present invention is generally related to light sources for use in digital light processing systems. More particularly, the present invention is directed to a light source for a digital light processing system formed from at least one array of extended cavity surface emitting semiconductor lasers.

BACKGROUND OF THE INVENTION

Digital light processing (DLP) is of interest for projection display systems, such as projecting images in conference rooms, home television systems, advertising displays, automobile dashboard and heads-up displays and other applications. In a DLP system a spatial light modulator modulates a light source in order to generate pixels at a projection surface with controlled intensity. A light valve is a type of spatial light modulator that modulates light across an array of elements. A light valve typically modulates optical transmission or reflection properties across an array. For example, a reflective liquid crystal light valves utilize an array of liquid crystals elements to modulate the intensity of reflected light across the array. Another common type of light valve is a digital micro-mirror device chip (often known as a "digital light valve") that has an array of movable micro-mirrors that can be individually tilted between two positions to vary the amount of light per-pixel that is reflected onto a display surface.

Cost considerations typically require that a single spatial modulator be used in a DLP system. Conventionally a bright white light is used as the light source. A rotating color wheel is used to separate out red, green, and blue light from the white light source. Thus, when the red filter of the color wheel is aligned to the white light source, red light is focused onto the spatial modulator for the red color of pixels, and so one for the green and blue filters of the color wheel.

There are several drawbacks to conventional DLP systems. First, the image is sometimes not as bright as desired. Conventional white light sources produce a limited number of lumens of light. Additionally, conventional DLP systems waste a considerable amount of the light energy. Second, some attributes of the displayed image, such as color saturation, are deleteriously affected by the color wheel, which can introduce artifacts into the displayed image. Third, DLP systems include expensive optical elements.

SUMMARY OF THE INVENTION

A projection display system includes a light source having arrays of semiconductor lasers generating light at several different colors. The semiconductor lasers are operated substantially incoherently with respect to each other and have a distribution of optical attributes selected to reduce speckle.

In one embodiment of a method, lasers in an array are driven in a sequence to match the illumination requirements of a spatial modulator for red, green, and blue light at different time intervals such that a color wheel is not required in a digital light processing system.

One embodiment of an apparatus for a projection display system comprises: a light source having a first array of extended cavity surface emitting semiconductor lasers adapted to generate a plurality of overlapping beams of red light; a second array of extended cavity surface emitting semiconductor lasers adapted to generate a plurality of overlapping beams of green light; and a third array of extended cavity surface emitting semiconductor lasers adapted to generate a plurality of overlapping beams of blue light; the light source configured to illuminate a spatial modulator of the projection display system with red, green, and blue light having a distribution of optical attributes of beams of individual semiconductor lasers selected such that an image generated by the projection display system on a projection screen is substantially free from speckle. In one embodiment light at two or more of the colors is generated using intracavity frequency doubling.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
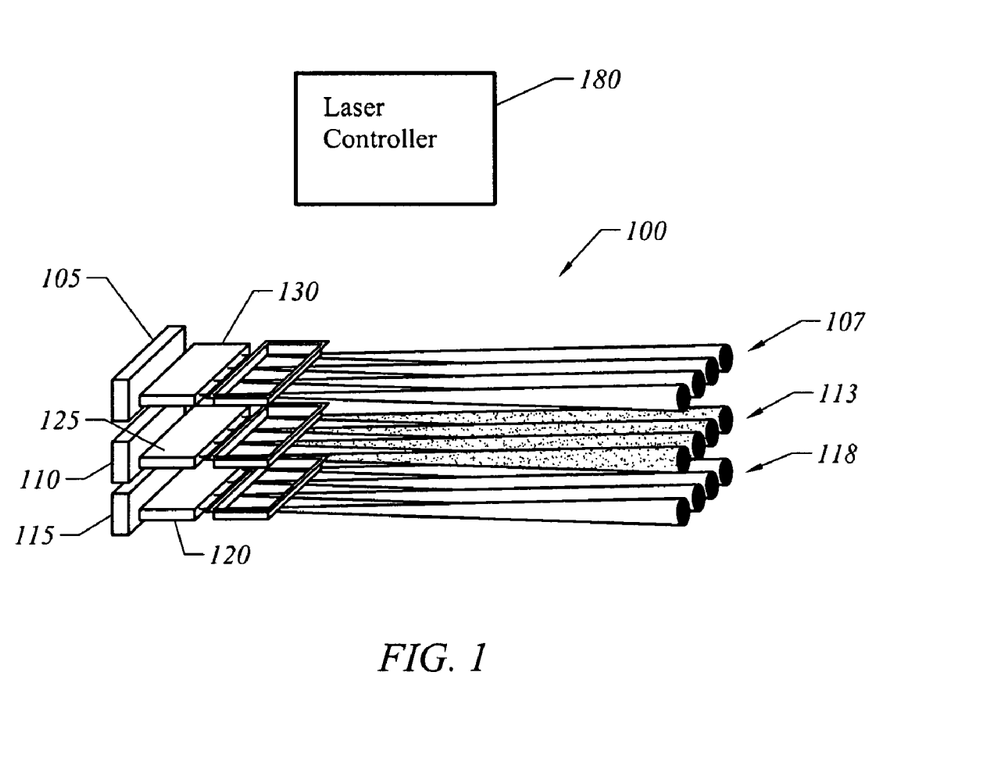
FIG. 1 is a perspective view illustrating a light source for use in a projection display in accordance with one embodiment of the present invention.

FIG. 1 is a profile view showing a light source 100 for generating light at several different colors required by a light processing (LP) system. In a red-green-blue (RGB) LP system the light source produces red, green, and blue light. A first array 105 of semiconductor lasers is used to generate a plurality of beams 107 of blue light from two or more individual lasers. A second array 110 of semiconductor lasers is used to generate a plurality of beams 113 of red light from two or more individual lasers. A third array of semiconductor lasers 115 is used to generate a plurality of beams 118 of green light from two or more individual lasers. Thus, light source 100 includes different sets of lasers. An individual set of two or more lasers generates a particular color of light used in the LP system. However, as described below in more detail, in a preferred embodiment individual lasers in a set are designed to be substantially incoherent (e.g., un-phased) with respect to other lasers in the same set in order to reduce speckle. In FIG. 1 each laser array 105, 110, and 115 is illustrated as generating four beams from four individual laser emitters (not shown). However, more generally each laser array 105, 110, 115 may have an arbitrary number of individual lasers.

Note that in one embodiment individual lasers and optical elements (not shown) in light source 100 are preferably arranged such that the individual beams 107, 113, and 118 of arrays 105, 110, and 115 at least partially overlap such that light source 100 provides uniform illumination of a spatial light modulator (not shown). The spatial light modulator may be a light valve, such as a digital-mirror light valve (sometimes known as a "digital light valve") having micromirrors, a light valve formed from an array of liquid crystal elements, or a liquid crystal on silicon (LCOS) spatial modulator. The initial overlap of individual beams 107, 113, and 118 may, for example, be only partial and increased by additional optical elements (not shown).

One or more of the arrays 105, 110, and 115 may utilize a nonlinear frequency converter 120, 125, or 130 to convert a source emission frequency into an output color of a different frequency. Nonlinear frequency conversion permits light emitted at one source frequency to be converted into another frequency. For example, in one embodiment the red, blue and green wavelengths are generated by frequency doubling a source laser frequency generated by a semiconductor gain element in individual lasers. In another embodiment, the red lasers operate directly in the red wavelength range but the green and blue colors are generated by frequency doubling. Alternatively, the red lasers can be made up of an array of green lasers that are parametrically down-converted by a nonlinear optical process. The nonlinear frequency converters 120 may be disposed within a laser resonator of each individual laser or be disposed outside of the resonator. Examples of nonlinear crystals that may be used as nonlinear frequency converters include periodically poled lithium niobate, periodically poled lithium tantalate, and periodically poled KTP. These nonlinear crystals may use appropriate dopants such as magnesium oxide to improve their reliability and/or poling quality.

Output couplers 120, 125, and 130 may be included to couple the light and to provide additional frequency stability. For example, the output couplers 120, 125, and 130 may include volume Bragg gratings for coupling light and providing frequency control of individual sub-arrays. In one embodiment one or more of the output couplers 120, 125, and 130 comprises volume Brag gratings, for example. Additionally, one or more wavelength controlling elements (not shown) may be included to control the wavelength of each laser. Examples of wavelength controlling elements include intra-cavity surface gratings, volume gratings, solid etalons, thin-film-coating etalons, and Lyot filters. These wavelength-controlling elements may be separate or may be monolithically combined with other intracavity elements for compactness and cost reduction reasons.

One aspect of the present invention is that the total optical power scales approximately with the total number of lasers in light source 100. As an illustrative example, light source 100 may be formed from three different semiconductor dies, each having at least one row of lasers. Additionally, power output may be further increased by including additional die in a tile configuration, such as two or more dies for at least one the arrays 105, 110, or 115. The packaged light source 100 may, for example, form an array of emitters having a total area on the order of one square centimeter. In one embodiment (not shown) the output from two or more light sources 100 is optically combined. Additionally optical techniques may also be used to combine the output of individual arrays 105, 110, and 115 with arrays emitting the same color. Examples of techniques to optically combine the light output of two or more arrays 105, 110, and 115 or two or more light sources 100 include dichroic optics or polarization beam combining optics.

Figure 2:
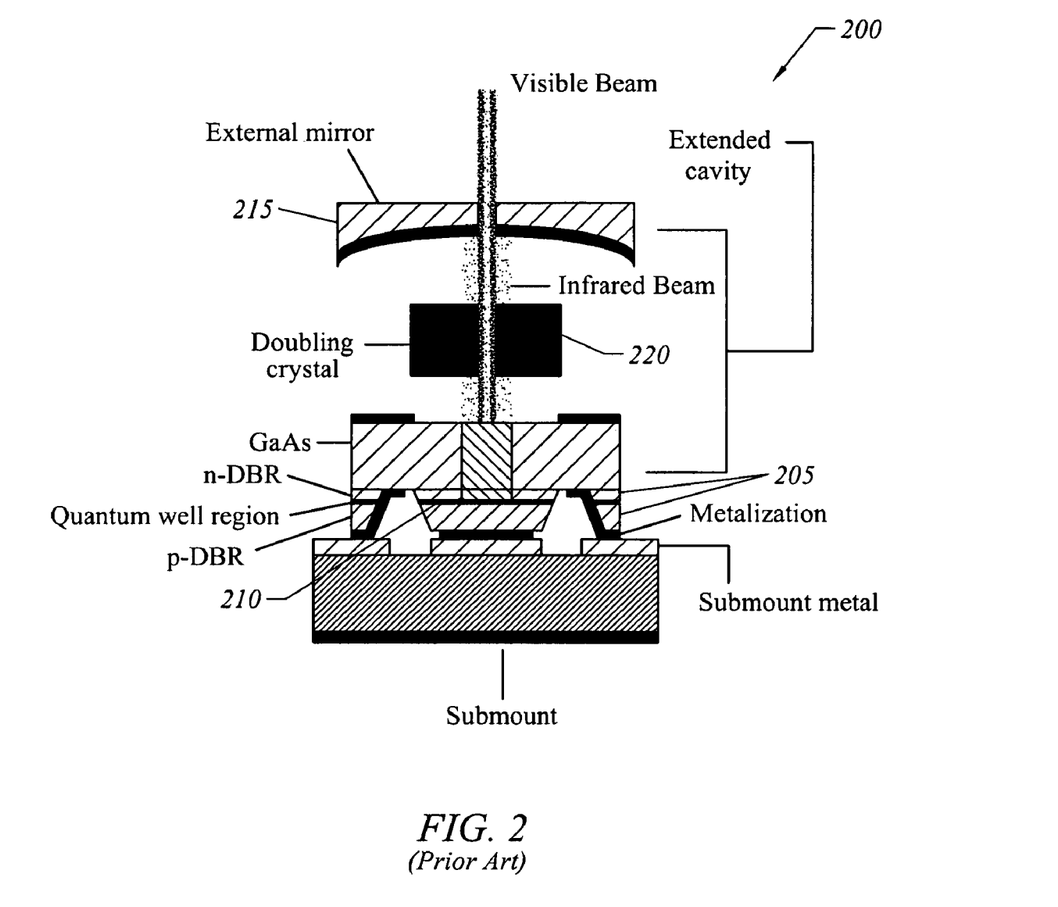
FIG. 2 illustrates an exemplary prior art extended cavity surface emitting laser.

Another aspect of the present invention is that one or more of the red, green, or blue arrays 105, 110, or 115 may be formed from extended cavity surface-emitting semiconductor lasers. FIG. 2 illustrates an exemplary prior art extended cavity surface emitting laser 200. Extended cavity surface-emitting semiconductor lasers are a class of semiconductor lasers that have a number of advantages over edge emitting semiconductor lasers or conventional surface emitting lasers. Extended cavity surface emitting lasers typically include at least one reflector disposed within a semiconductor gain element. For example, an intra-cavity pair of Bragg mirrors 205 grown on either side of a quantum well gain region 210 form a Fabry-Perot resonator to define the operating wavelength of the fundamental laser wavelength. An additional external reflector 215 spaced apart from the semiconductor gain element defines an extended cavity of an optical resonator, providing additional wavelength control. By appropriate selection of the quantum well gain region 210, Bragg mirrors 205, and external reflector 215 a fundamental wavelength can be selected within a large range of wavelengths. The fundamental wavelength, in turn, may then be frequency doubled by frequency doubling optical crystal 220 to generate light at a desired color.

Additional optical elements, including optical frequency doubling optical crystal 220 or other frequency conversion devices, may be included in the optical resonator of the extended cavity for intra-cavity frequency conversion. As another example, a saturable absorber (not shown) may be included in the extended cavity (or within the semiconductor gain element) to form a mode-locked laser. An efficient mode-locked extended cavity semiconductor laser is described in copending application, Ser. No. 11/194,141, "Apparatus, System, and Method for Wavelength Conversion of Mode-Locked Extended Cavity Surface Emitting Semiconductor Lasers," filed on the same day as the present application, the contents of which are hereby incorporated by reference.

Extended cavity surface-emitting semiconductor lasers developed by the Novalux Corporation of Sunnyvale, Calif. have demonstrated high optical power output, long operating lifetimes, accurate control of laser wavelength, control of spatial optical mode, provide the benefit of surface emission for convenient manufacturing and testing, and may be adapted to include optical frequency conversion elements, such as second harmonic frequency doublers, to generate light at the red, green, and blue colors. Additionally, an array of high power extended cavity surface emitting lasers may be fabricated on a single die such that light source 100 may be fabricated in a highly manufacturable process that utilizes only a small number of different semiconductor dies, frequency converters, and frequency control elements. As a result, a light source 100 utilizing extended cavity surface emitting arrays may be manufactured that has a useful power output at red, green, and blue colors that is greater than conventional white light LP systems and which may be manufactured at a reasonable price due to the high manufacturability. Background information describing individual extended cavity surface emitting semiconductor lasers and frequency-doubled surface emitting lasers developed by the Novalux Corporation are described in U.S. Pat. Nos. 6,243,407, 6,404,797, 6,614,827, 6,778,582, and 6,898,225, the contents of each of which are hereby incorporated by reference. Other details of extended cavity surface emitting lasers are described in U.S. patent application Ser. Nos. 10/745,342 and 10/734,553, the contents of which are hereby incorporated by reference. Additionally details regarding exemplary extended cavity surface-emitting semiconductor lasers are described below in more detail.

In one embodiment the lasers in light source 100 are designed to be operated in a pulsed mode. Electrical connectors (not shown) are provided to drive each individual laser of each array 105, 110, and 115. A laser controller 180 is used to regulate drive current and/or voltage of each laser array 105, 110, and 115. Laser controller 180 preferably permits individual laser arrays 105, 110, 115 to be operated in a pulsed mode. In one embodiment, laser controller 180 permits individual laser arrays 105, 110, and 115 to be operated sequentially, i.e., to generate red light during one time interval, green light during another time interval, and blue light during another time interval, thereby eliminating the necessity in a LP system for a color wheel to filter light. In one embodiment individual lasers and subgroups of lasers are independently addressable by laser controller 180. Laser controller 180 may also use feedback from optical monitors (not shown) to adjust drive current/voltage to maintain selected output characteristics. For example, laser controller 180 may adjust drive current or pulse width to maintain a desired grey scale in a LP system. In one embodiment a manufactured laser array 105, 110, and 115 includes at least one redundant laser. In this embodiment, laser controller 180 determines an initial set of operable lasers that are used in each array. The redundant lasers kept in reserve are then turned on as required to replace lasers that have failed, thereby increasing the useful lifetime of light source 100.

In one embodiment, each laser array 105, 110, and 115 is driven in a pulsed mode. A pulsed mode operation provides a number of benefits, including reduced heat dissipation. Additionally a pulsed mode of operation may also, depending upon pulse parameters, provide beneficial spectral broadening. Light valves typically have a characteristic time that is required for them to change reflective or transmissive states and an associated minimum on-time. In a pulsed mode of operation light source 100 preferably generates pulses having a high repetition rate such that the period between optical pulses is small compared with the minimum on-time of the light valve. Consequently, a high repetition rate permits a pre-selected minimum number of laser pulses to strike a micro-mirror of a digital light valve during its shortest possible on-cycle, improving grey scale resolution. An exemplary repetition rate is as fast as 1 MHz, which is considerably faster than conventional frame repetition rates used in television, video, and computer graphics. More generally the repetition rate can be selected based upon the characteristics of particular LP systems. For example, the laser repetition rates are preferably high enough to be compatible with achieving a full grey scale with commercially available digital mirror light valves or liquid crystal light valves that are used in boardroom projectors and home television.

Light source 100 is preferably designed to substantially reduce speckle in a LP system to acceptable levels, i.e., to reduce speckle to a level that provides people viewing an image in a LP system with an acceptable viewing experience. As is well known in the field of optics, speckle results when coherent light is reflected from scatter centers. The resulting interference generates bright and dark patches having a speckled appearance. Speckle can be numerically characterized by a peak-to-valley intensity modulation of a speckle pattern, i.e., the percentage variation in peak-to-valley intensity between bright and dark patches. One rule that is sometimes used in the LP art is that a speckle modulation of about 4% or less is required in a LP system to achieve an acceptable viewing experience.

In the context of LP systems illuminated by a laser, speckle occurs as coherent light reflects from scattering centers in the light valve or in other optical elements of the LP system. Speckle generates optical non-uniformities that degrade the optical quality of the projected image. Speckle is a particularly severe problem in LP systems receiving highly coherent light from a single laser source. As is well known in the field of optics, coherence is associated with the ability of light waves to constructively and destructively interfere. A single laser source that has a narrow distribution of optical frequencies, phase, and spatial attributes is highly coherent and thus is prone to generating speckle.

In accordance with one embodiment of the present invention, speckle is reduced in a LP system using light source 100 by several different techniques that may be used alone or in combination to reduce coherence in light source 100 by increasing the distribution of optical attributes (e.g., phase, spectral width) of light source 100. First, increasing the number of lasers of the same color in light source 100 that are substantially incoherent with respect to each other will tend to reduce speckle. Even though each laser in a single array 105, 110, or 115 emits coherent laser light at the same color, un-phased lasers of the same color having different phases are incoherent to each other in regards to the optical interference effects that cause speckle. As a result, the speckle-induced intensity variations for each un-phased laser is independent of that of other lasers such that the combined illumination uniformity for an array 105, 110, or 115 of un-phased lasers improves as the number of un-phased lasers increases. In particular, speckle tends to decrease inversely with the square root of the number of un-phased lasers of the same color having equal amplitude. The lasers in each array are thus preferably designed to operate un-phased with respect to each other, i.e., an individual array 105, 110, or 115 is designed to not provide significant inter-laser feedback that would significantly lock the frequency and phase of two or more lasers in the array to each other. Second, since spectral broadening reduces speckle, any operating mode that broadens the spectra will tend to decrease speckle. Examples of techniques to broaden the spectra of semiconductor lasers include operating lasers in a pulsed mode with the pulse parameters (e.g., on time) selected to generate spectral broadening; high frequency modulation of lasers selected to generate spectral broadening; mode-locking lasers to generate spectral broadening, and sub-combinations thereof such as operating mode-locked lasers in a pulsed mode. Third, the individual lasers in an array 105, 110, and 115 may be designed to operate with multiple frequency, axial, or spatial modes to increase the frequency, phase, and directional (angular) distribution of each laser. Fourth, an optical element may be used to scramble the direction, phase, and polarization information of the beams 107, 113, and 118 to reduce coherence.

Figure 3:
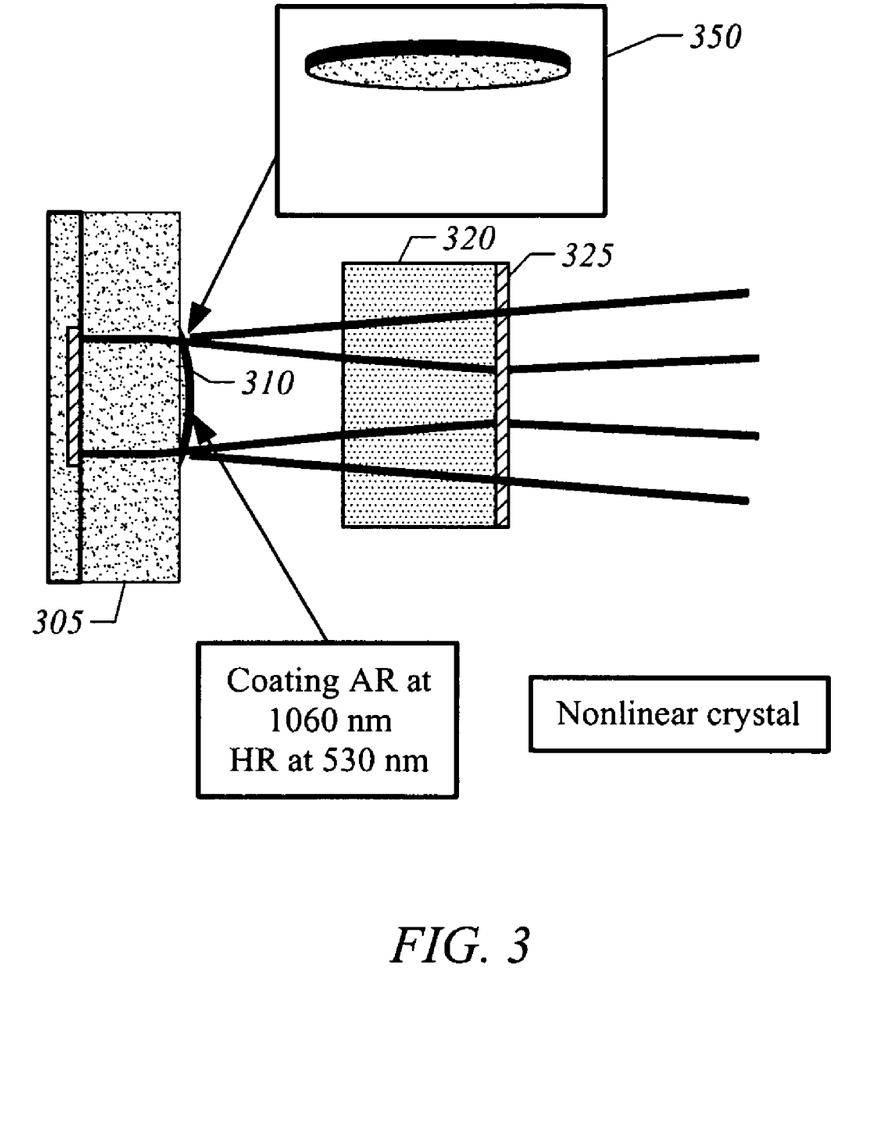
FIG. 3 illustrates an individual surface emitting diode laser gain element for use in a light source in accordance with one embodiment of the present invention.

It is desirable that the extended cavity lasers used in laser arrays 105, 110, and 115 have stable optical characteristics. Additionally, if frequency doubling is used it is desirable to minimize dephasing effects that reduce the efficiency of the second harmonic conversion process. FIG. 3 illustrates an extended cavity surface emitting laser 300 having a lens 310 for stabilizing the optical mode and reducing deleterious dephasing in a frequency doubling process. Each laser gain element 305 includes an optical gain region and may also include one or more distributed Bragg reflectors (not shown). In one embodiment an etched lens 310 is formed on the semiconductor substrate 315. In an alternate embodiment an external lens (not shown) is used instead of etched lens 310 with the external lens formed using conventional optical materials, such as optical glass. A profile of an exemplary fabricated etched lens 310 is illustrated in detailed inset 350. A nonlinear optical material 320 is contained in the laser resonator. A resonant mirror 325 is deposited directly on the nonlinear material or may be a grating device, both of which are designed to control the output wavelength to match the phase-matching wavelength of the nonlinear optical material 320. However, it will be understood that other techniques may be used to fabricate individual elements of arrays.

The intra-cavity lens 310 is used to provide a stable transverse mode (preferably a $TEM_{00}$ mode) in a semi-confocal configuration. In this arrangement, the infrared light (i.e., the fundamental frequency light generated by the semiconductor which is to be frequency doubled) is focused into the nonlinear optical material 320 while the forward going harmonic light is transmitted through a flat output coupler (not shown) and the backward harmonic light is reflected from the surface of the lens 310 that is coated to be highly transparent to the fundamental wavelength and highly reflective at the harmonic wavelength. This lens element acts as a convex mirror for the harmonic light and will have a reduced intensity in the nonlinear material as it overlaps the fundamental wavelength laser beam.

The reduced intensity in the overlap region with the fundamental laser beam in the nonlinear optical material 320 will have the advantage of reducing any dephasing effect that would reduce the overall nonlinear conversion efficiency. The beam divergence of the forward and backward waves is about the same. The mode waist position of the harmonic light of the forward wave is near the output mirror position while that for the backward wave is at the virtual image of the reflective mirror. These two beams will propagate in the same direction but with somewhat different beam angles.

The focusing lens 310 in the cavity can be made by etching the surface of the semiconductor or by the introduction of a glass or binary optical lens, all of which can be made in an array format. The introduction of such a lens in the cavity would reduce the variable effects of thermal lensing usually present in most laser systems that have materials with a positive dn/dt (change of refractive index with temperature). However, an embodiment that relies on the thermal lens only to stabilize the spatial mode of the cavity is also within the scope of this invention. In this case, a more conventional method for extracting the backward-propagating second-harmonic beam can be used, for example, via a 45-degree beamsplitter.

A nonlinear crystal 320 is placed either at or near the output mirror (not shown) or it may have a mirror 325 deposited directly to it that is highly transmissive at the harmonic and highly reflective at the fundamental wavelength. If a separate output mirror is used it may also be comprised of a volume holographic grating for wavelength selection or any other wavelength resonant reflector such as a replica grating or a resonant etalon reflector. Alternatively, a mirror may be a conventional glass element coated with a broadband coating and a wavelength selector such as a solid or thin-film deposited etalon may be placed into the cavity at a tilt angle. Such an element (grating or etalon) may be separate or integrated with other elements (for compactness and cost reduction). For example, a conventional grating or a thin-film interference filter may be deposited on a wedged surface of the nonlinear crystal or the second (intracavity-looking) surface of the output mirror. The output mirror may also be a convex reflector designed to provide an intermediate focus point in the cavity where the nonlinear optical material 320 is placed, thereby doubling the effective path length in the nonlinear crystal.

It will be understood that light source 100 may be adapted for use with different types of spatial modulators besides light valves. In one embodiment, light source 100 may also have an optical lens system designed to generate a single beam for use in a scanning optical system. In a scanning optical system the spatial modulator comprises mirrors that are used to scan a laser beam in an X-Y raster motion. For a scanning optical system, each of the beams in the array should preferably be nearly diffraction limited.

Figure 4:
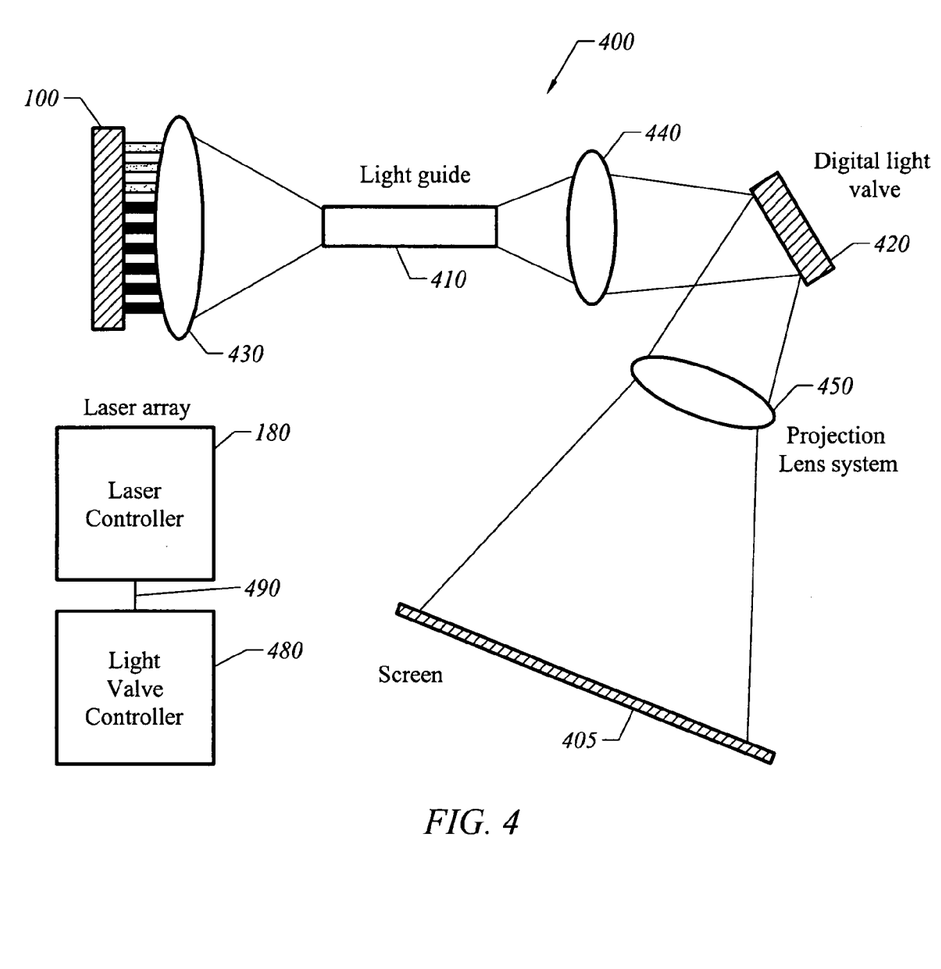
FIG. 4 illustrates a projection display system in which arrays of red, blue and green or more colors are focused into a light guide that is subsequently imaged onto a micro-display light valve and then re-imaged onto a screen in either a front or rear projection display system.

FIG. 4 is a block diagram of a LP system 400 in accordance with one embodiment of the present invention illustrating a schematic layout of the optical path from a light source 100 to a projection screen 405. The beams from light source 100 can be focused into a light guide 410, rectangular in most cases, and then focused onto a light valve 420 (e.g., a digital light valve) after the beam emerges from light guide 410. The beams generated by light source 100 will have some initial overlap. However, the light guide may be selected to increase the overlap of the beams. In particular, internal reflection, diffraction, mode conversion, or other electromagnetic properties of a waveguide may be used to scramble the beams within light guide 410. In this case, all the beams will overlap with some degree of uniformity with reduced speckle that might be present in each of the beams separately. In the case of mode-locked laser arrays, additional reduction of speckle will occur from the spectral broadening of the mode-locked pulses. Pulsed devices that have spectral broadening due to chirping or operation in several spatial or spectral modes will also have some degree of speckle reduction.

The individual lasers in system 400 may be un-phased. Pulsed operation will tend to broaden the spectrum of the individual lasers, therefore, reducing the degree of their coherence and reducing speckle. A single lens 430 will focus all of the lasers beams that are traveling parallel to one another to one focal spot with a spot size determined by the diameter of each beam and the focal length of lens 430. Each sub-aperture may be filled by expanding the laser beam to the pitch of the array and then subsequently focused with a single lens 430 to provide the smallest spot size for all the beams. The input laser beams undergo several bounces within light guide 410 that tend to scramble the beams so that the output light exits light guide 410 with a rectangular pattern that is uniformly filled to match the digital light valve.

In one embodiment system 400 includes a laser controller 180 for controlling the laser array and a light valve controller 480 for controlling the light valve. The two controllers preferably have a link 490 for communicating with each other. In one embodiment, laser controller 180 controls operational attributes of light source 100 such as repetition rate. A sensor (not shown) may be included for the laser controller 180 to monitor laser output and control the output power. For the case of a mode-locked laser, the laser controller 180 can also control the operation of saturable absorbers used to mode-lock the lasers.

Laser controller 180 also determines whether the red, green, or blue lasers of light source 100 emit light during a particular portion of time during a frame. In one embodiment, LP system 400 does not have a color filter wheel. Instead, the red, green, and blue portions of a frame are generated by synchronizing the red, green, and blue lasers of light source 100 to operate in a burst mode during different times of the frame. In a burst mode, only one set of lasers (e.g., red, green, or blue) is used to generate a train of optical pulses. Thus, in each frame to be displayed, the laser controller and light valve controller 480 communicate with each other to synchronize turning on only the red lasers when the red portion of pixels are to be projected by light valve 420, turn on only the green lasers when the green portion of the pixels are to be projected by the light valve 420, and turn on only the blue lasers when the blue portions of the pixels are to be projected by light valve 420. This coordination allows a system with a single digital light valve chip to eliminate a color wheel filter, improves reliability and efficiency, and improves the quality of the displayed image.

Additionally, in some embodiments the laser repetition rate is adjusted by laser controller 180 to account for the response time of individual elements in light valve 420, such as individual mirrors in a digital light valve. Digital light valves control grey scale by pulse width modulation of the on/off response of the micro-mirrors. An individual micro-mirror of a digital light valve has a rise and fall time associated with rotating the micro-mirror between an off-state to an on-state. A burst of laser light of a specific color (e.g., red) is a sequence of pulses. As previously mentioned, selection of a comparatively high nominal pulse rate facilitates control of gray scale. A high pulse rate permits a comparatively small minimum mirror on-time to be used (since a number of optical pulses in the burst will be capable of being deflected to the projection screen).

In one embodiment the pulse repetition rate of each laser in light source 100 is adjusted to optimize the optical response in the most critical rise/fall portions of the micro-mirror of a digital light valve. For example, the mirror of a digital light valve tilts within a finite range of motion, such as 10 to 15 degrees. However the last 1 to 2 degrees of tilt have a great impact on control of the grey scale. By adjusting the repetition rate based on the turn on/turn off response of the micro-mirror, the optical response of the digital light valve may be optimized. It will also be understood that with sufficient synchronization of the digital light valve and each laser array 105, 110, and 115 that the turn-on and turn-off of each laser array burst may be advantageously timed to initiate or stop a train of pulses at precise times with respect to the turn on or turn off phases of the micro-mirrors. Additionally, it will be understood that the repetition rate of a laser array 105, 110, and 115 may be dynamically varied during a burst.

In one embodiment, the effective pulse rate is increased by electrically dividing each array 105, 110, 115 into separate sub-sections ("sub-arrays") that are driven with different phases to increase the effective pulse rate. In this embodiment the different sub-arrays of a single color are each pulsed with a separate driver delayed in phase with respect to each other. The phase difference may, for example, be selected to be a fraction of the pulse repetition rate divided by the number of sub-arrays in order to increase the total repetition rate of pulses of each color. This would overcome any pulse repetition rate limitations for any individual element of the array in order to achieve any appropriate gray scale and to be compatible with the digital mirror pulse widths and rise and fall times of the micro-mirrors.

Figure 5:
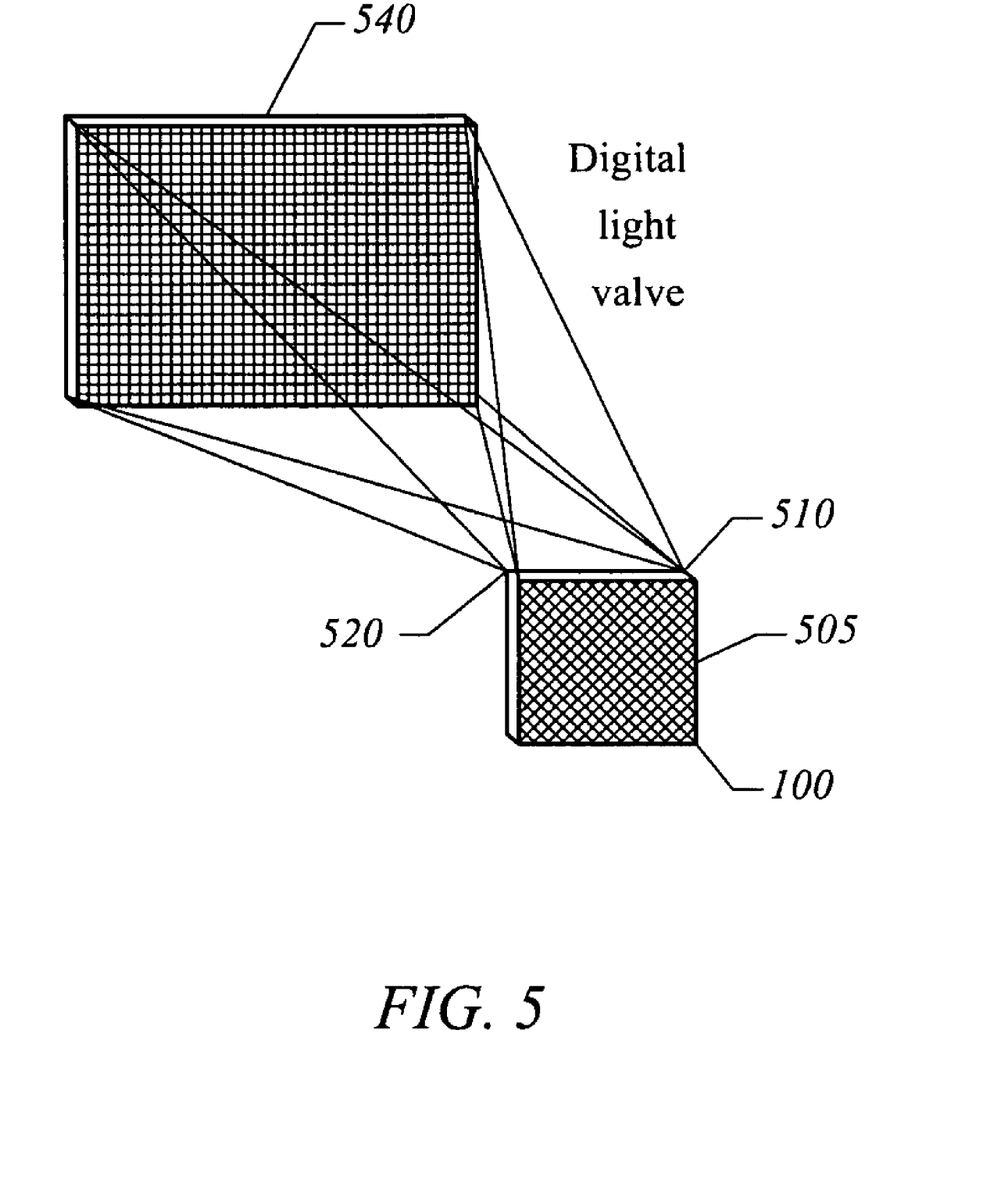
FIG. 5 illustrates a projection display system in which a diffractive optical element is used to convert the circular Gaussian laser beam from each laser element in the light source into a rectangular top-hat distribution that is subsequently directed to efficiently cover the entire area of the light valve and then subsequently imaged onto a front or rear projection screen.

FIG. 5 illustrates an embodiment of a projection system that includes an optical lens system 505 (illustrated by the checkerboard pattern) designed to convert the optical output from each laser in light source 500 to a profile that matches that of a light valve 540. For example, an individual laser element 510 has an optical element that converts its output into an optical output that matches that of the light valve 540. Similarly, another individual laser element 520 has an optical element that converts its output into an optical output that matches that of the light valve. A benefit of this arrangement is that the optical uniformity on the surface of light valve 540 is independent of which individual laser elements in light source 500 are operative. That is, the result of optical lens system 505 is that the output from each laser overlaps at light valve 540 with the same profile. Thus, failure of one or more of the individual laser elements 510 or 520 will not affect the illumination uniformity across light valve 540. Consequently, in the event that an individual laser element fails the power output of other laser elements can be increased to compensate for the loss in power with no change in illumination uniformity. Moreover, this arrangement facilitates the use of redundant lasers that are turned on as required to maintain the power output.

In one embodiment optical lens system 505 projects each laser beam in the array of light source 500 into a rectangular top-hat intensity profile 510 that is imaged onto the digital light valve 520. An optical element, such as a diffractive optical element, is used to convert the circular Gaussian laser beam from each element in light source 500 into a rectangular top-hat optical distribution that is subsequently directed to efficiently cover the entire area of the light valve and then subsequently imaged onto a front or rear projection screen. This lens system may be reflective, diffractive, or transmissive and may be made from a glass lens array or a digital optical lens system, for example. Digital optical lens systems may be made from a variety of materials, such as plastics. Digital optical lens systems are available from a variety of vendors, such as MEMS Optical, Inc, of Huntsville, Ala. As one example, optical lens system 505 may comprise an assymetric binary optical lens arrangement designed to generate a top-hat intensity distribution for an array of lasers that each generate a circular Gaussian laser beam. More generally, optical lens system may be designed using optical modeling techniques taking into account a desired intensity profile to be imaged onto a light valve 540, selecting an arrangement of lasers in light source 500, and the beam properties of each laser in light source 500.

The optical lens system 505 permits each laser in the array to have an optical beam profile that approximately matches the profile of the digital light valve. The optical lens system is preferably designed so that each laser in the array has a nearly identical rectangular top-hat intensity profile projected onto the digital light valve. This allows a near perfect match of each laser to the digital light valve. Moreover, the total optical system of a LP system may be less costly in spite of the addition of optical lens system 505 because a conventional three prism dichroic lens system can be eliminated in a LP system. Additionally, the failure of an individual laser can be accounted for by adjusting the power of other lasers. The system of FIG. 5 allows the projection system to have a uniform light intensity and to maintain this intensity over the life of the system by being able to control the total optical power from the array. This may be accomplished by increasing the drive current to the array or by having additional (redundant) laser elements in the array that may be turned on at a later time.

Each surface emitting laser array 105, 110, and 115 may be wired so that all elements can be in series or some combination of series and parallel operation. This would allow for a power supply with improved efficiency due to reduced currents and reduced resistive heating. In addition, the series wired array would be driven with one current to avoid thermal runaway. Further, each color sub-array can be driven for only one third of the time in sequence in contrast to lamps which are on all of the time and use a color filter wheel to select only one color while rejecting the other wavelengths from the lamp.

While the present invention has been described in regards to a light source generating three primary colors, it will also be understood that light sources 100 and 500 may be adapted to generate a different sequence of colors or more than three colors by selecting the characteristics and numbers of laser arrays to achieve beams with the desired output colors. Thus it will be understood that the present invention is not limited to use in light projection systems based on red, green, and blue (RGB) light sources. For example, if a light projection system requires a different set of colors than RGB the light sources 100 and 500 of the present may be adapted to include arrays of lasers generating each of the different colors required by the light projection system. It will also be understood that nonlinear frequency conversion may be extended to frequency tripling or quadrupling.

Some types of spatial modulators work most efficiently with polarized light. As one example, certain types of liquid-crystal modulators modulate polarized light. It will be understood that in some embodiments light sources 100 and 500 are designed with the polarization selected to facilitate modulation by a spatial modulator that modulates polarized light.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention

What is claimed is:

1. An apparatus for a projection display system, comprising:
    a light source configured to illuminate a spatial modulator with red, green, and blue light, the light source including:
        a first array of surface emitting semiconductor lasers adapted to generate a plurality of overlapping beams of red light in which individual surface emitting semiconductor lasers in the first array are substantially incoherent with respect to surface emitting semiconductor lasers of the same color;
        a second array of extended cavity surface emitting semiconductor lasers adapted to generate a plurality of overlapping beams of green light in which individual surface emitting semiconductor lasers in the second array are substantially incoherent with respect to surface emitting semiconductor lasers of the same color; and
        a third array of extended cavity surface emitting semiconductor lasers adapted to generate a plurality of overlapping beams of blue light in which individual surface emitting semiconductor lasers in the third array are substantially incoherent with respect to surface emitting semiconductor lasers of the same color;
    each of said arrays being configured into a plurality of sub-arrays in which each sub-array can be independently addressed; and
    a laser controller and associated drivers with a plurality of different driver phase delays configured to drive the sub-arrays of each array in a pulse mode at a common pulse rate but with different phases selected to increase the effective pulse rate of each color.

2. The apparatus of claim 1 further comprising an array of optical elements configured to project each laser beam of said light source into a uniform top-hat spatial intensity distribution matched to said spatial modulator.

3. The apparatus of claim 1 wherein each of said sub-arrays are pulse modulated in a time sequence burst mode with respect to each other such that they are on for a fraction of the time and synchronized with said light valve in order to provide the necessary gray scale for each color.

4. The apparatus of claim 1 wherein said light source further comprises a light guide for coupling light between each said array to said light valve, said light guide adapted to scramble beams from individual lasers of each array.

5. The apparatus of claim 1 in which at least one of said arrays includes a nonlinear optical crystal contained within a laser cavity.

6. The apparatus of claim 1 in which the red, blue, and green wavelengths are achieved by frequency doubling with a nonlinear optical crystal outside of a laser cavity.

7. The apparatus of claim 1 in which an array of intra-cavity lenses is provided to form a stable spatial mode resonator.

8. The apparatus of claim 7 in which the intra-cavity lenses are etched on the surface of a substrate or are bonded to the surface of the substrate.

9. The apparatus of claim 7 in which the intra-cavity lenses are formed from thermal gradients in the semiconductor chip.

10. The apparatus of claim 1 in which each of said arrays comprises a plurality of surface emitting laser elements connected in series or in a series/parallel combination.

11. The apparatus of claim 1 in which each extended cavity semiconductor laser of at least one of said arrays has a fundamental wavelength controlled by a wavelength controlling element selected from the group consisting of intra-cavity surface gratings, volume gratings, solid etalons, thin-film-coating etalons, and Lyot filters.

12. The apparatus of claim 11 in which the wavelength-controlling element performs at least one other optical function in each said extended cavity semiconductor laser.

13. The apparatus of claim 1 in which in each said extended cavity semiconductor laser visible harmonic radiation is coupled out of the cavity by a dichroic filter or a polarization selective prism in which the orthogonal harmonic light is reflected at a near right angle and the fundamental wavelength is transmitted with low loss.

14. The apparatus of claim 1 in which a wavelength of each extended cavity semiconductor laser is controlled by an intra-cavity pair of Bragg mirrors grown on either side of the gain region to form a Fabry-Perot resonator to define the operating wavelength of the fundamental laser wavelength.

15. The apparatus of claim 1 in which the nonlinear optical materials are chosen from the group consisting of periodically poled lithium niobate, periodically poled lithium tantalate, and periodically poled KTP.

16. The apparatus of claim 1, in which two or more arrays for one of said colors are tiled together to increase the total optical output power for a particular color.

17. The apparatus of claim 1 in which a plurality of arrays are frequency converted and tiled together to produce an array of beams of different colors.

18. The apparatus of claim 1 in which laser elements of each array are individually addressable.

19. The apparatus of claim 1 in which sub-groups of arrays are individually addressable.

20. The apparatus of claim 1 in which some individual lasers of at least one of said arrays are not operated during some initial time period in order to reserve them for use at a later time to replace failing lasers.

21. The apparatus of claim 1, wherein each laser of one of said arrays is multiple spatial mode or multiple axial mode laser.

22. The apparatus of claim 1 in which said beams of said arrays are transmitted through an array optical system comprised of diffractive or other optical elements designed to project a diffraction-limited beam.

23. The apparatus of claim 1, wherein the number of lasers and distribution of optical attributes in each array being such that an image generated by said projection display system on a projection screen is substantially free from speckle.

24. A projection display light system, comprising:
a spatial modulator having an array of elements for generating pixels on a projection screen;
a light source configured to illuminate said spatial modulator, said light source including:
a first array of surface emitting semiconductor lasers adapted to generate a plurality of overlapping beams of red light, in which individual surface emitting semiconductor lasers in the first array are substantially incoherent with respect to surface emitting semiconductor lasers of the same color
a second array of emitting semiconductor lasers adapted to generate a plurality of overlapping beams of green light in which individual surface emitting semiconductor lasers in the second array are substantially incoherent with respect to surface emitting semiconductor lasers of the same color; and
a third array of surface emitting semiconductor lasers adapted to generate a plurality of overlapping beams of blue light in which individual surface emitting semiconductor lasers in the third array are substantially incoherent with respect to surface emitting semiconductor lasers of the same color;
and a laser controller configured to synchronize light output of each laser of each said array of said light source to match input light illumination requirements of said spatial modulator;
at least one optical element to convert the optical output of each individual laser of each array into a pattern that matches the spatial modulator so that the addition or deletion of the optical contribution of an individual laser will not significantly affect illumination uniformity across the spatial modulator; and
the laser controller monitoring optical output of the light source, determining an initial set of active lasers in each array along with a initial set of redundant lasers with the laser controller turning on redundant lasers as required to maintain optical illumination power levels of the light source during the lifetime of the projection light system.

25. The light system of claim 24, wherein said at least one optical element comprises an array of optical elements configured to project each laser beam of said light source into a uniform top-hat spatial intensity distribution matched to said spatial modulator.

26. The light system of claim 24, wherein said at least one optical element comprises a light guide adapted to scramble beams from individual lasers of each array.

27. The system of claim 24, wherein the number of lasers and distribution of optical attributes in each array being such that an image generated by said projection display system on a projection screen is substantially free from speckle.

28. An apparatus for a projection display system, comprising:
a light source configured to illuminate a spatial modulator with red, green, and blue light, the light source including:
a first array of surface emitting semiconductor lasers adapted to generate a plurality of overlapping beams of red light in which individual surface emitting semiconductor lasers in the first array are substantially incoherent with respect to surface emitting semiconductor lasers of the same color, the first array including at least two different laser die tiled together;
a second array of extended cavity surface emitting semiconductor lasers adapted to generate a plurality of overlapping beams of green light in which individual surface emitting semiconductor lasers in the second array are substantially incoherent with respect to surface emitting semiconductor lasers of the same color, the second array including at least two different laser die tiled together; and
a third array of extended cavity surface emitting semiconductor lasers adapted to generate a plurality of overlapping beams of blue light in which individual surface emitting semiconductor lasers in the third array are substantially incoherent with respect to surface emitting semiconductor lasers of the same color, the third array including at least two different laser die tiled together;
each of said arrays being configured into a plurality of sub-arrays in which each sub-array can be independently addressed; and
a laser controller and associated drivers to drive each array.

29. The display system of claim 28, wherein the associated drivers have a plurality of different driver phase delays configured to drive the sub-arrays of each array in a pulse mode at a common pulse rate but with different phases selected to increase the effective pulse rate of each color.

30. The display system of claim 28, further comprising at least one optical element to convert the optical output of each individual laser of each array into a pattern that matches the spatial modulator so that the addition or deletion of the optical contribution of an individual laser will not significantly affect illumination uniformity across the spatial module, the laser controller monitoring optical output of the light source, determining an initial set of active lasers in each array along with a initial set of redundant lasers with the laser controller turning on redundant lasers as required to maintain optical illumination power levels of the light source during the lifetime of the projection light system.

* * * * *